United States Patent
Hodono (10) Patent No.: US 8,229,256 B2
(45) Date of Patent: Jul. 24, 2012

(54) OPTO-ELECTRIC HYBRID MODULE AND METHOD OF MANUFACTURING THE SAME

(75) Inventor: Masayuki Hodono, Ibaraki (JP)

(73) Assignee: Nitto Denko Corporation, Obaraki-shi, Osaka (JP)

( * ) Notice: Subject to any disclaimer, the term of this patent is extended or adjusted under 35 U.S.C. 154(b) by 204 days.

(21) Appl. No.: 12/698,574

(22) Filed: Feb. 2, 2010

(65) Prior Publication Data

US 2010/0209054 A1    Aug. 19, 2010

(30) Foreign Application Priority Data

Feb. 16, 2009   (JP) .................................. 2009-032997

(51) Int. Cl.
    *G02B 6/13*    (2006.01)
(52) U.S. Cl. ........................................ 385/14; 29/829
(58) Field of Classification Search ............... 385/14
    See application file for complete search history.

(56) References Cited

U.S. PATENT DOCUMENTS 6,624,512 B2 *   9/2003   Kurusu ......................... 257/737
2008/0317402 A1 * 12/2008   Kodama et al. ................... 385/14

FOREIGN PATENT DOCUMENTS

JP          2004-302345 A     10/2004

* cited by examiner

*Primary Examiner* — Sarah Hahm
(74) *Attorney, Agent, or Firm* — Westerman, Hattori, Daniels & Adrian, LLP (57) ABSTRACT

An opto-electric hybrid module capable of achieving the reduction in distance between an optical element and a core end portion to improve the efficiency of light coupling therebetween, and a method of manufacturing the same are provided. The opto-electric hybrid module includes an optical waveguide section, an electric circuit section, and a light-emitting element (7) and a light-receiving element (8) both mounted on the electric circuit section. The optical waveguide section includes an under cladding layer (1), a linear core (2) for an optical path, the core being formed on a surface of the under cladding layer (1), and an over cladding layer (3) formed on the surface of the under cladding layer (1) and covering the core (2). An electric circuit (4) is formed on a surface portion of the under cladding layer (1) except where the core (2) is formed.

6 Claims, 8 Drawing Sheets

PRIOR ART

OPTO-ELECTRIC HYBRID MODULE AND METHOD OF MANUFACTURING THE SAME

BACKGROUND OF THE INVENTION

1. Field of the Invention

The present invention relates to an opto-electric hybrid module including an optical waveguide section, an electric circuit section, and an optical element mounted on the electric circuit section, and to a method of manufacturing the same.

2. Description of the Related Art

Figure 8:
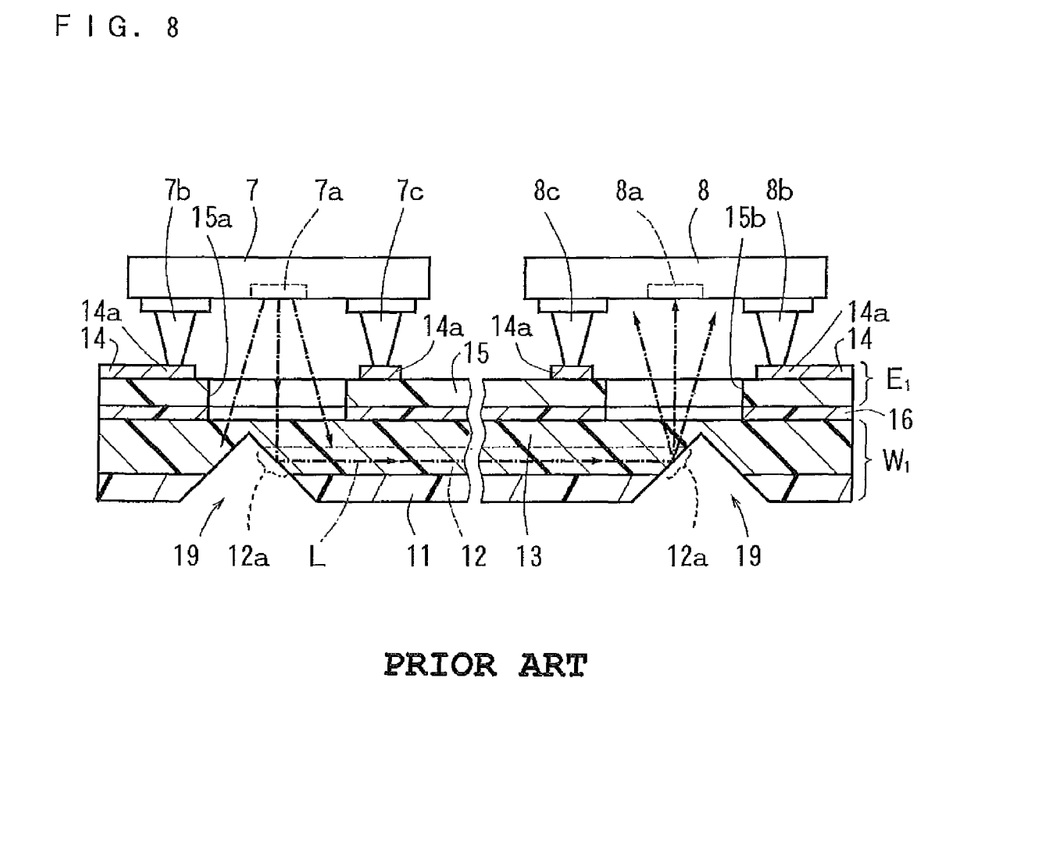
FIG. 8 is a vertical sectional view schematically showing a conventional opto-electric hybrid module.

As shown in FIG. 8, an opto-electric hybrid module is constructed, for example, using a technique to be described below. First, an electric circuit section $E_1$ in which an electric circuit 14 is formed on the surface of a substrate 15, and an optical waveguide section $W_1$ in which an under cladding layer 11, a core 12 and an over cladding layer 13 are disposed in the order named are produced individually. The back surface of the substrate 15 in the electric circuit section $E_1$ is bonded to the front surface of the over cladding layer 13 in the optical waveguide section $W_1$ with an adhesive 16. A light-emitting element 7 and a light-receiving element 8 are mounted on portions of the electric circuit section $E_1$ corresponding to opposite end portions of the core 12 in the optical waveguide section $W_1$. Such a technique is disclosed, for example, in Japanese Patent Application Laid-Open No. 2004-302345. The substrate 15 includes light-passing through holes 15a and 15b formed therein for propagation of light L between the end portions of the core 12 and the light-emitting and light-receiving elements 7 and 8. A notch 19 of an inverted V shape is formed in the optical waveguide section $W_1$ near each of the opposite ends of the core 12. One side surface defined by the inverted V-shaped notch 19 on the core 12 side is formed as an inclined surface inclined at 45 degrees to the axial direction of the core 12. An end portion of the core 12 lying at the inclined surface serves as a light reflecting surface 12a. In FIG. 8, the reference character 7a designates a light-emitting section in the light-emitting element 7, and 7b and 7c designate bumps in the light-emitting element 7. The reference character 8a designates a light-receiving section in the light-receiving element 8, and 8b and 8c designate bumps in the light-receiving element 8.

The propagation of the light L in the opto-electric hybrid module will be described. First, the light L is emitted downwardly from the light-emitting section 7a of the light-emitting element 7. The light L passes through the through hole 15a for light propagation formed in the electric circuit section $E_1$ and then through the over cladding layer 13 near a first end portion (as seen in FIG. 8, the left-hand end portion) of the optical waveguide section $W_1$, and thereafter enters a first end portion of the core 12. Subsequently, the light L is reflected from one of the light reflecting surfaces 12a provided in the first end portion of the core 12, and travels through the interior of the core 12 in the axial direction. The light L is propagated to a second end portion (as seen in FIG. 8, the right-hand end portion) of the core 12. Subsequently, the light L is reflected upwardly from the other light reflecting surface 12a provided in the second end portion of the core 12. Then, the light L passes through and exits from the over cladding layer 13, and is received by the light-receiving section 8a of the light-receiving element 8.

In the course of the above-mentioned propagation of the light L, the light L emitted from the light-emitting section 7a of the light-emitting element 7 is diffused as shown in FIG. 8. For this reason, if there is a long distance between the light-emitting element 7 and the light reflecting surface 12a provided in the first end portion of the core 12, the light L deviates away from the light reflecting surface 12a and is not guided into the core 12 in some cases. Similarly, the light L reflected from the light reflecting surface 12a provided in the second end portion of the core 12 is also diffused. For this reason, the light L deviates away from the light-receiving section 8a of the light-receiving element 8 and is not received by the light-receiving section 8a in some cases. It is therefore necessary to design the opto-electric hybrid module so as to minimize the distance between optical elements such as the light-emitting and light-receiving elements 7 and 8 and the light reflecting surfaces 12a provided in the end portions of the core 12 in the optical waveguide section $W_1$.

Conventional opto-electric hybrid modules, however, are constructed such that the electric circuit section $E_1$ comprised of the substrate 15 and the electric circuit 14 is disposed between the optical elements such as the light-emitting and light-receiving elements 7 and 8 and the optical waveguide section $W_1$. This makes the distance between the optical elements such as the light-emitting and light-receiving elements 7 and 8 and the end portions of the core 12 accordingly long which thereby result in the lowered efficiency of light coupling therebetween.

SUMMARY OF THE INVENTION

In view of the foregoing, it is therefore an object of the present invention to provide an opto-electric hybrid module capable of achieving the reduction in distance between an optical element and a core end portion to improve the efficiency of light coupling therebetween, and a method of manufacturing the same.

To accomplish the above-mentioned object, a first aspect of the present invention is an opto-electric hybrid module comprising: an optical waveguide section; an electric circuit section; and an optical element mounted on the electric circuit section, said optical waveguide section including an under cladding layer, a linear core for an optical path, the core being formed on a surface of the under cladding layer, and an over cladding layer formed so as to cover the core, said electric circuit section being formed on a surface portion of the under cladding layer except where the core is formed, without any substrate.

A second aspect of the present invention is a method of manufacturing an opto-electric hybrid module including an optical waveguide section, an electric circuit section, and an optical element mounted on the electric circuit section, wherein the production of the optical waveguide section comprises the steps of: forming an under cladding layer; forming a linear core for an optical path on a surface of the under cladding layer; and forming an over cladding layer on the surface of the under cladding layer so as to cover the core, and wherein the electric circuit section is produced on a surface portion of the under cladding layer except where the core is formed, without any substrate.

The present inventor has made studies of the placement of the electric circuit section in an opto-electric hybrid module to reduce the distance between the optical element and an end portion of the core. As a result, the present inventor has found that the formation of the electric circuit section on the surface of the under cladding layer where the core is formed without any substrate allows the position of the mounting of the optical element to approach the end portion of the core as compared with the prior art (with reference to FIG. 8). Thus, the present inventor has attained the present invention.

In the opto-electric hybrid module according to the present invention, the distance between the optical element and the end portion of the core is reduced because the electric circuit section is formed on the surface portion of the under cladding layer except where the core is formed, without any substrate. When the optical element is a light-emitting element, the opto-electric hybrid module enables light emitted from a light-emitting section of the light-emitting element to enter a first end portion of the core before the light is widely diffused. Similarly, when light exits from a second end portion of the core (when the optical element is a light-receiving element), the opto-electric hybrid module also enables the light exiting from the second end portion of the core to be received by a light-receiving section of the light-receiving element before the light is widely diffused. In this manner, the opto-electric hybrid module according to the present invention is significantly improved in the efficiency of light coupling between the optical element and the end portion of the core.

Preferably, bump positioning guides for positioning bumps of the optical element are formed on the surface of the under cladding layer and are placed in predetermined positions relative to the end portion of the core, and the bumps of the optical element are positioned using the bump positioning guides. In such a case, the mounting of the optical element on the end portion of the core is higher in accuracy. This further improves the efficiency of light coupling between the optical element and the end portion of the core.

In the method of manufacturing the opto-electric hybrid module according to the present invention, the electric circuit section is produced on the surface portion of the under cladding layer except where the core is formed, without any substrate. This reduces the distance between the optical element and the end portion of the core to achieve the manufacture of the opto-electric hybrid module with improved efficiency of light coupling therebetween.

Preferably, the method further comprises the step of forming bump positioning guides on the surface of the under cladding layer, and the mounting of the optical element comprises the step of positioning bumps of the optical element by using the bump positioning guides. In such a case, the high-accuracy positioning of the optical element is achieved easily. This improves the productivity of the opto-electric hybrid module.

These and other objects, features, aspects and advantages of the present invention will become more apparent from the following detailed description of the present invention when taken in conjunction with the accompanying drawings.

DESCRIPTION OF THE EMBODIMENTS

Embodiments according to the present invention will now be described in detail with reference to the drawings.

Figure 1A:
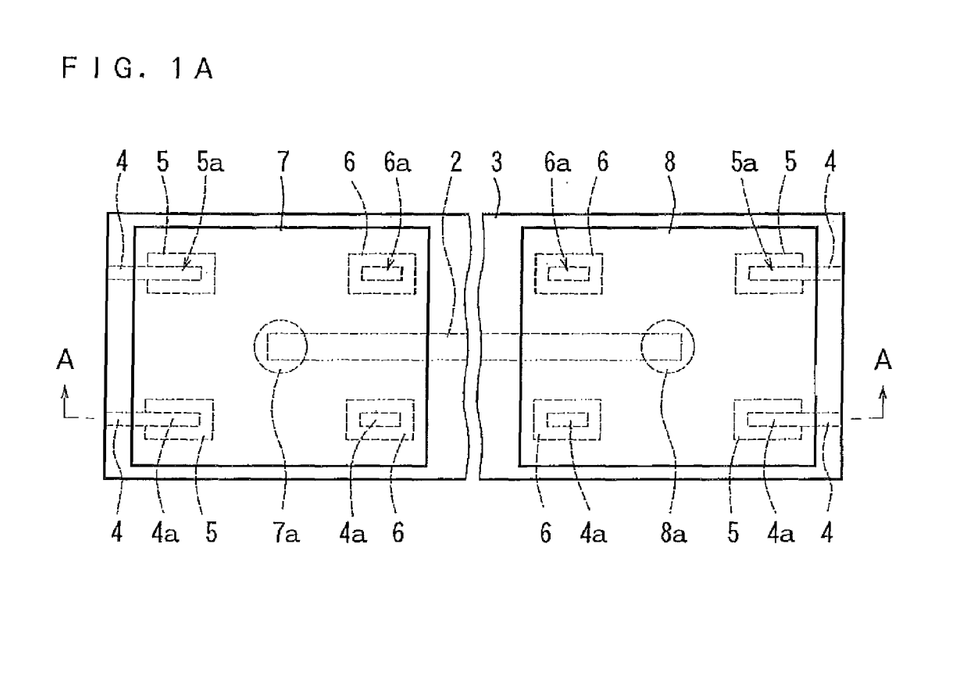
FIG. 1A is a plan view schematically showing an opto-electric hybrid module according to a first embodiment of the present invention.
Figure 1B:
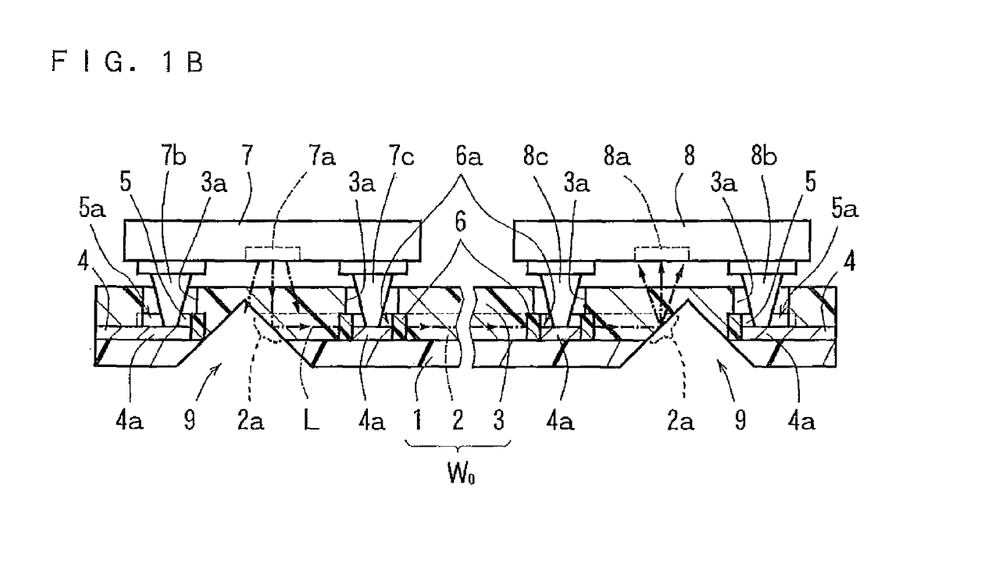
FIG. 1B is a sectional view taken along the line A-A of FIG. 1A.

FIG. 1A is a plan view schematically showing an opto-electric hybrid module according to a first embodiment of the present invention. FIG. 1B is a sectional view taken along the line A-A of FIG. 1A. The opto-electric hybrid module according to the first embodiment includes an under cladding layer 1, a linear core 2 for an optical path formed on a surface of the under cladding layer 1, and an electric circuit (substrateless electric circuit section) 4 formed directly on a portion of the surface of the under cladding layer 1 other than the portion where the core 2 is formed, without any substrate therebetween. The term "substrateless electric circuit section" is used herein to distinguish an electric circuit formed directly on the surface of the under cladding layer without any substrate therebetween from a conventional electric circuit formed thereon with a substrate therebetween.

Part of the electric circuit 4 serves as mounting pads 4a for connecting bumps 7b, 7c, 8b and 8c of optical elements (a light-emitting element 7 and a light-receiving element 8) thereto. The four mounting pads 4a are formed around each of the opposite end portions of the core 2, and are located in predetermined positions relative to each of the opposite end portions of the core 2. Four bump positioning guides 5 and 6 for locating the bumps 7b, 7c, 8b and 8c of the optical elements (the light-emitting element 7 and the light-receiving element 8) are provided in a protruding condition on the surface of the under cladding layer 1 so as to surround the four mounting pads 4a, respectively. Two bump positioning guides 5 out of the four bump positioning guides 5 and 6 are formed in a U shape as seen in plan view, and the two remaining bump positioning guides 6 are formed in the shape of a rectangular frame as seen in plan view. The bumps 7b, 7c, 8b and 8c are not shown in FIG. 1A.

An over cladding layer 3 is further formed on the surface of the under cladding layer 1 so as to cover the entire core 2, portions of the electric circuit 4 other than the mounting pads 4a, and portions of the bump positioning guides 5 and 6 other than hollow portions 5a and 6a. The over cladding layer 3 includes through holes 3a formed in positions corresponding to over the mounting pads 4a. The optical elements 7 and 8 are placed over the over cladding layer 3. The optical elements 7 and 8 are flip-chip mounted using an electrically conductive paste, solder and the like as a bonding material (not shown), with the bumps 7b, 7c, 8b and 8c of the optical elements 7 and 8 inserted through the through holes 3a of the over cladding layer 3 into the hollow portions 5a and 6a of the bump positioning guides 5 and 6 in the U shape and in the shape of the rectangular frame as seen in plan view.

The under cladding layer 1, the core 2 and the over cladding layer 3 constitute an optical waveguide section $W_0$. A notch 9 of an inverted V shape is formed in a portion of the optical waveguide section $W_0$ corresponding to each of the opposite end portions of the core 2. One side surface defined by the inverted V-shaped notch 9 on the core 2 side is formed as an inclined surface inclined at 45 degrees to the axial direction of the core 2. An end portion of the core 2 lying at the inclined surface serves as a light reflecting surface 2a. The light reflecting surfaces 2a are formed under a light-emitting section 7a provided in the light-emitting element 7 and under a light-receiving section 8a provided in the light-receiving element 8.

In the opto-electric hybrid module, light L is propagated in a manner to be described below. As shown in FIG. 1B, the light L emitted downwardly from the light-emitting section 7a of the light-emitting element 7 passes through the over cladding layer 3, and thereafter enters a first end portion of the core 2. Then, the light L is reflected from the light reflecting surface 2a provided in the first end portion of the core 2, and travels through the interior of the core 2 in the axial direction. The light L is propagated to the light reflecting surface 2a provided in a second end portion of the core 2. Subsequently, the light L is reflected upwardly from the light reflecting surface 2a provided in the second end portion of the core 2. Then, the light L passes through and exits from the over cladding layer 3, and is received by the light-receiving section 8a of the light-receiving element 8.

In this manner, the opto-electric hybrid module is configured to form the electric circuit 4 directly on the surface of the under cladding layer 1 where the core 2 is formed, without a substrate as in the conventional module therebetween, to thereby shorten the distance between the optical elements 7 and 8 and the end portions of the core 2. This enables the light L emitted from the light-emitting section 7a of the light-emitting element 7 to enter the first end portion of the core 2 before the light L is diffused so widely in the course of the above-mentioned propagation of the light L. Similarly, this also enables the light L exiting from the second end portion of the core 2 to be received by the light-receiving section 8a of the light-receiving element 8 before the light L is diffused so widely. In other words, the opto-electric hybrid module according to the first embodiment is significantly improved in the efficiency of light coupling between the optical elements 7 and 8 and the end portions of the core 2, as compared with conventional modules.

The opto-electric hybrid module according to the first embodiment is manufactured, for example, in a manner to be described below. FIGS. 2A to 2C, 3, 4A, 4B, 5A, 5B, 6A and 6B show a method of manufacturing the opto-electric hybrid module according to the first embodiment. Sectional views included among these figures are those taken along the line A-A of FIG. 1A.

First, a base 10 of a flat shape (with reference to FIG. 2A) for use in the formation of the under cladding layer 1 is prepared. Examples of a material for the formation of the base 10 include glass, quartz, silicon, resin, metal and the like. The thickness of the base 10 is, for example, in the range of 20 μm to 5 mm.

Figure 2A:
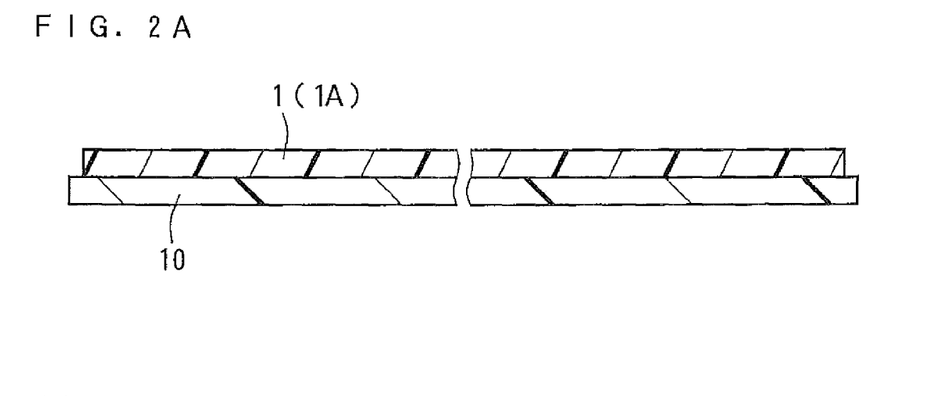
FIG. 2A is an illustration schematically showing the step of forming an under cladding layer in an optical waveguide section in a method of manufacturing the opto-electric hybrid module.

Then, as shown in FIG. 2A, a varnish prepared by dissolving a photosensitive resin for the formation of the under cladding layer 1 such as a photosensitive epoxy resin and the like in a solvent is applied to a predetermined region of the surface of the base 10. Thereafter, a heating treatment (at 50 to 120° C. for approximately 10 to 30 minutes) is performed, as required, to dry the varnish, thereby forming a photo sensitive resin layer 1A for the formation of the under cladding layer 1. Then, the photosensitive resin layer 1A is exposed to irradiation light such as ultraviolet light and the like. This causes the photosensitive resin layer 1A to be formed into the under cladding layer 1. The thickness of the under cladding layer 1 is typically in the range of 1 to 50 μm.

Figure 2B:
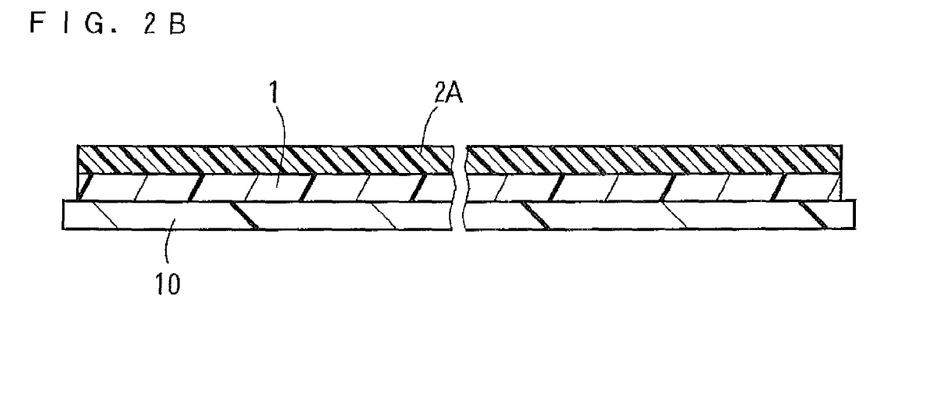
FIGS. 2B and 2C are illustrations schematically showing the step of forming a core and bump positioning guides in the manufacturing method.
Figure 2C:
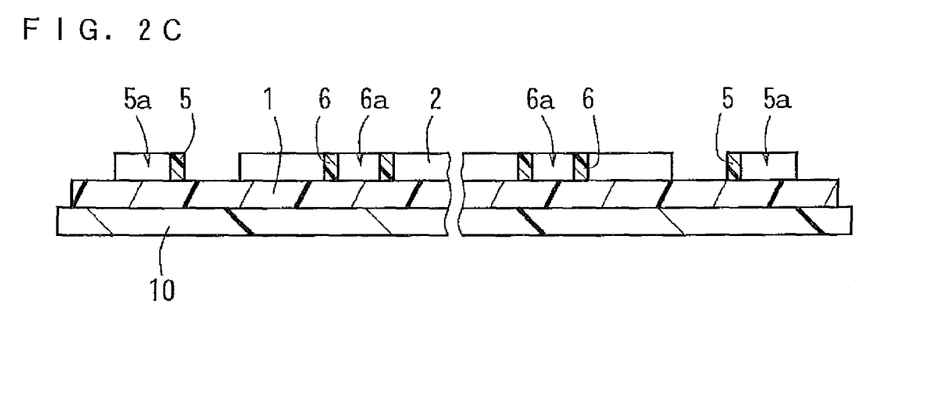
Figure 3:
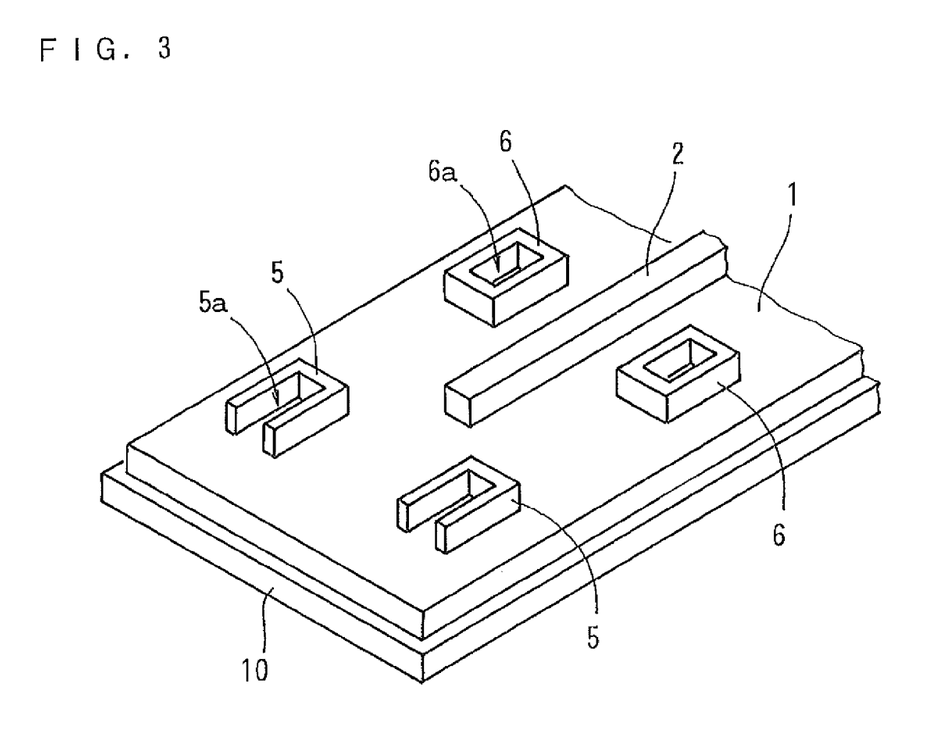
FIG. 3 is a perspective view on an enlarged scale showing a core end portion and its vicinity in the manufacturing method.

Next, as shown in FIG. 2B, a photosensitive resin layer 2A is formed on the surface of the under cladding layer 1 in a manner similar to the process for forming the photosensitive resin layer 1A for the formation of the under cladding layer 1. Then, the photosensitive resin layer 2A is exposed to irradiation light through a photomask formed with an opening pattern corresponding to the pattern of the core 2 and the bump positioning guides 5 and 6. Next, a heating treatment is performed. Thereafter, development is performed using a developing solution to dissolve away unexposed portions of the photosensitive resin layer 2A, as shown in FIG. 2C and FIG. 3 (which is a perspective view on an enlarged scale showing the left-hand end portion of the core 2 of FIG. 2C and its vicinity), thereby forming the remaining photosensitive resin layer 2A into the pattern of the core 2 and the bump positioning guides 5 and 6. In this manner, the single photolithographic process is performed to form the core 2 and the bump positioning guides 5 and 6 having a predetermined pattern at the same time, thereby locating the bump positioning guides 5 and 6 in predetermined positions relative to each end portion of the core 2.

The arrangement of the bump positioning guides 5 and 6 is done in corresponding relation to the arrangement of the bumps 7b, 7c, 8b and 8c (with reference to FIGS. 1A and 1B) of the optical elements 7 and 8 to be mounted. The bump positioning guides 5 and 6 are fence-like in the U shape and in the shape of the rectangular frame as seen in plan view. Application of the electrically conductive paste along these shapes allows the accurate positioning of the mounting pads 4a (with reference to FIGS. 4A and 4B) made of the electrically conductive paste.

In the formation of the core 2 and the bump positioning guides 5 and 6, the thickness (height) of the core 2 and the bump positioning guides 5 and 6 is typically in the range of 5 to 60 μm. The width of the core 2 is typically in the range of 5 to 60 μm. The dimensions of the bump positioning guides 5 and 6 are as follows. The bump positioning guides 5 in the U shape as seen in plan view are tailored to the size of the mounting pads 4a. The outside dimensions of the bump positioning guides 5 are typically in the range of 80 to 200 μm by 80 to 200 μm, and the U-shaped line width thereof is typically in the range of 5 to 50 μm. The outside dimensions of the bump positioning guides 6 in the shape of the rectangular frame as seen in plan view are typically in the range of 50 to 120 μm by 50 to 120 μm, and the line width of the rectangular frame thereof is typically in the range of 5 to 20 μm.

A material for the formation of the core 2 and the bump positioning guides 5 and 6 includes, for example, a photosensitive resin similar to that of the under cladding layer 1 described above, and the material used herein has a refractive index greater than that of the material for the formation of the above-mentioned under cladding layer 1 and the over cladding layer 3 to be described below. The adjustment of such refractive indices may be made, for example, by adjusting the selection of the types of the materials for the formation of the under cladding layer 1, the core 2 (including the bump positioning guides 5 and 6) and the over cladding layer 3, and the composition ratio thereof.

Figure 4A:
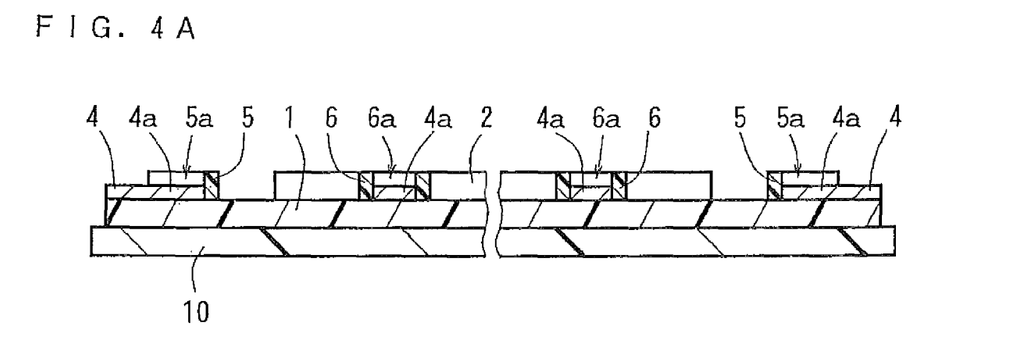
FIG. 4A is an illustration schematically showing the step of producing an electric circuit in the manufacturing method.
Figure 4B:
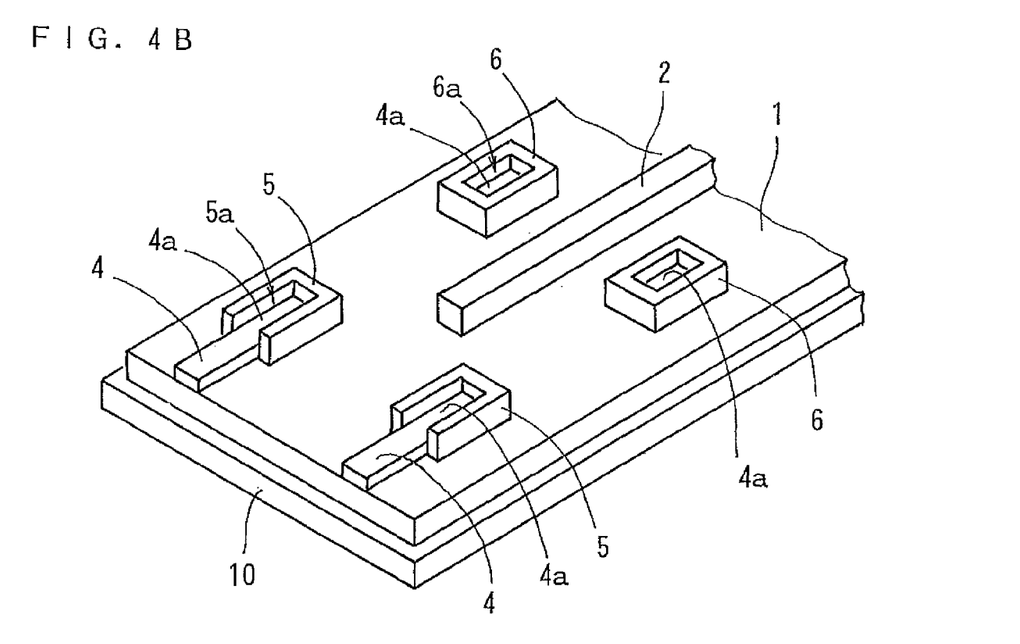
FIG. 4B is a perspective view on an enlarged scale showing the core end portion and its vicinity in the manufacturing method.

Next, as shown in FIGS. 4A and 4B, an electrically conductive paste such as a paste of copper, silver and the like is formed in a linear shape on predetermined portions of the surface of the under cladding layer 1. Thereafter, a curing process (at 150 to 200° C. for approximately 30 minutes to one hour) is performed, as required, to form the electric circuit 4. Part of the electric circuit 4 corresponding to the hollow portions 5a and 6a of the bump positioning guides 5 and 6 in the U shape and in the shape of the rectangular frame as seen in plan view serves as the mounting pads 4a for connecting the bumps 7b, 7c, 8b and 8c (with reference to FIGS. 1A and 1B) of the optical elements (the light-emitting element 7 and the light-receiving element 8) thereto. The formation of the electrically conductive paste in the linear shape is carried out, for example, by using a screen printing method, a method employing a dispenser, an inkjet method, or the like. The thickness of the electric circuit 4 is typically in the range of 5 to 100 μm.

The bump positioning guides 5 and 6 function not only as positioning guides for use in the placement of the electrically conductive paste but also as a dam structure for stopping the electrically conductive paste placed in position from flowing out.

Figure 5A:
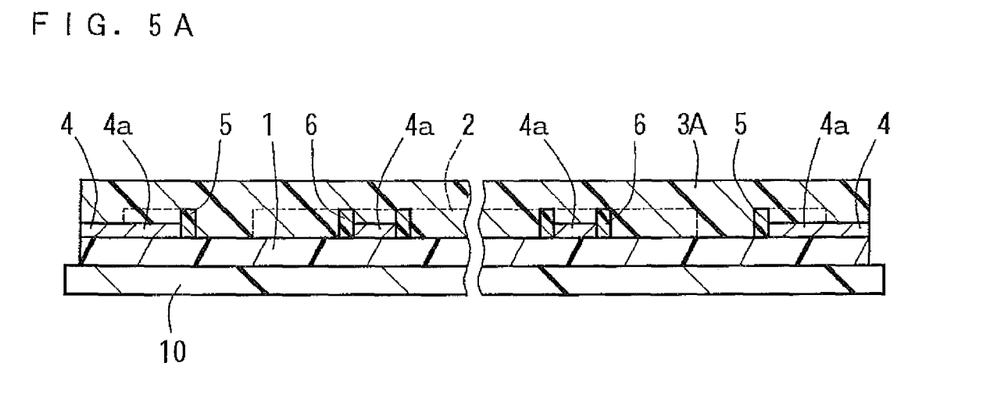
FIGS. 5A and 5B are illustrations schematically showing the step of forming an over cladding layer in the optical waveguide section in the manufacturing method.
Figure 5B:
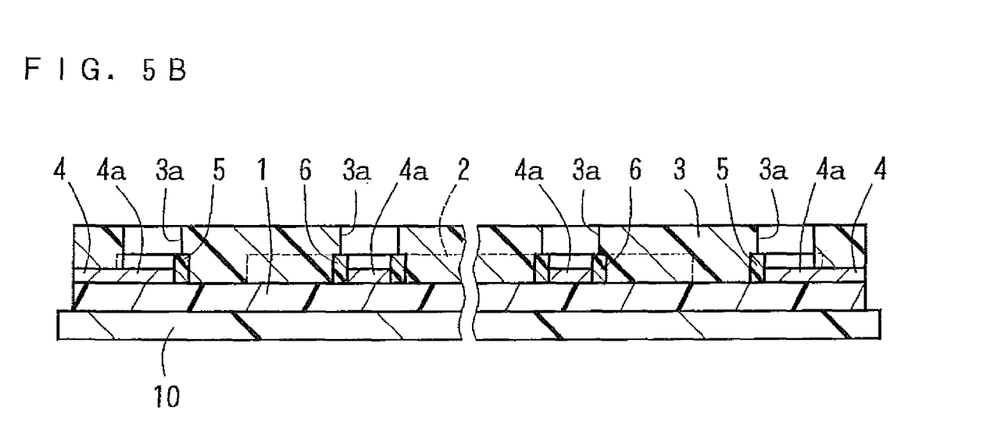

Next, as shown in FIG. 5A, a photosensitive resin layer 3A for the formation of the over cladding layer 3 is formed on the surface of the under cladding layer 1 in a manner similar to the process for forming the photosensitive resin layer 1A for the formation of the under cladding layer 1 (with reference to FIG. 2A) so as to cover the core 2, the bump positioning guides 5 and 6, and the electric circuit 4. Then, the photosensitive resin layer 3A is exposed to irradiation light through a photomask designed so that part of the photosensitive resin layer 3A covering the mounting pads 4a is not exposed to the irradiation light. Next, a heating treatment is performed. Thereafter, development is performed using a developing solution to dissolve away unexposed portions of the photosensitive resin layer 3A, as shown in FIG. 5B, thereby forming the over cladding layer 3 in which the portions dissolved away correspond to the through holes 3a. This uncovers the mounting pads 4a in the through holes 3a of the over cladding layer 3. The thickness of the over cladding layer 3 is typically in the range of 10 to 2000 μm. An example of the material for the formation of the over cladding layer 3 used herein includes a photosensitive resin similar to that of the under cladding layer 1.

Figure 6A:
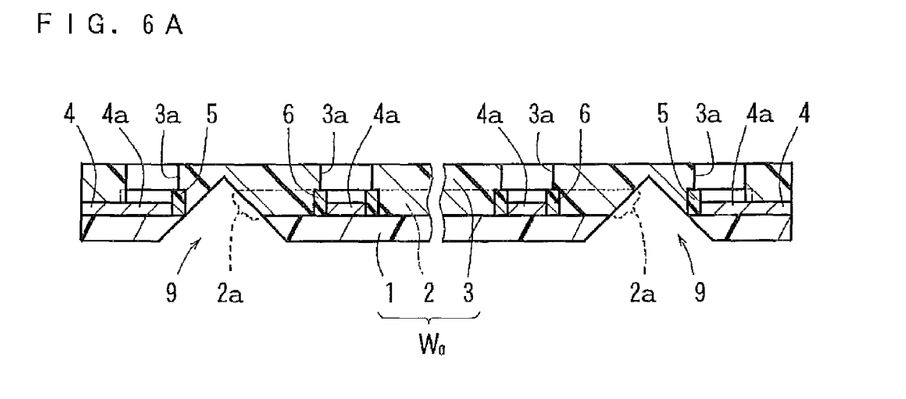
FIG. 6A is an illustration schematically showing the step of forming a light reflecting surface in each core end portion in the manufacturing method.

Then, the base 10 is stripped from the back surface of the under cladding layer 1. Thereafter, a dicing blade including a V-shaped edge having an included angle of 90 degrees or the like is used to cut the opposite end portions of the core 2 from the back surface side of the under cladding layer 1, thereby forming the notches 9 of the inverted V shape in the positions corresponding to the opposite end portions, respectively, of the core 2, as shown in FIG. 6A. This causes the portions of the core 2 corresponding to the inverted V shape to be formed into the respective light reflecting surfaces 2a inclined at 45 degrees. The light reflecting surfaces 2a are formed under the light-emitting section 7a of the light-emitting element 7 to be mounted in the subsequent step and under the light-receiving section 8a of the light-receiving element 8 to be mounted in the subsequent step.

Figure 6B:
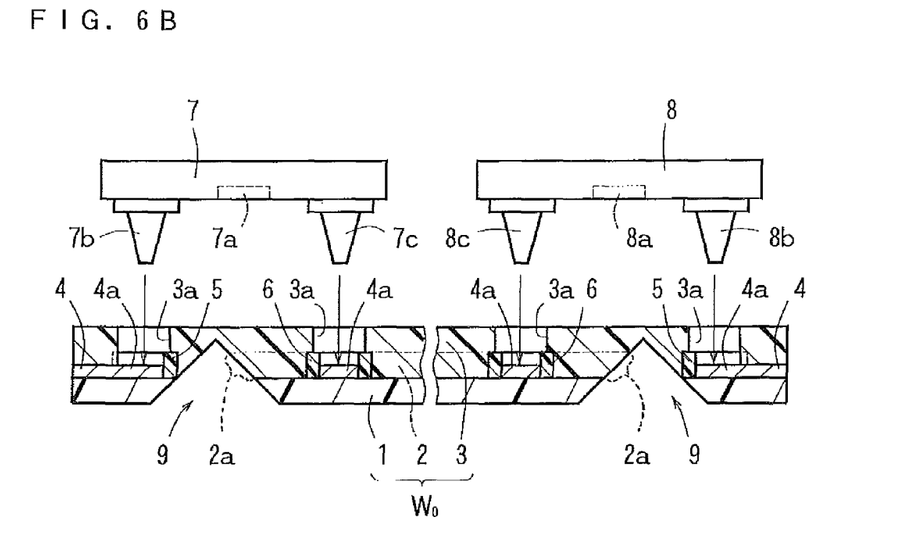
FIG. 6B is an illustration schematically showing the step of mounting an optical element in the manufacturing method.

Then, a mounting machine such as a flip chip bonder is used to insert the bumps 7b, 7c, 8b and 8c of the light-emitting and light-receiving elements 7 and 8 through the through holes 3a of the over cladding layer 3 into the hollow portions 5a and 6a of the bump positioning guides 5 and 6 in the U shape and in the shape of the rectangular frame as seen in plan view, as shown in FIG. 6B, and thereafter to connect the bumps 7b, 7c, 8b and 8c to the mounting pads 4a, thereby flip-chip mounting the light-emitting element 7 and the light-receiving element 8 by using the electrically conductive paste, solder and the like as a bonding material (not shown).

In this manner, the intended opto-electric hybrid module (with reference to FIGS. 1A and 1B) is provided.

Examples of the light-emitting element 7 include a VCSEL (Vertical Cavity Surface Emitting Laser) and the like. Examples of the light-receiving element 8 include a PD (Photo Diode) and the like. The bumps 7b, 7c, 8b and 8c of the optical elements 7 and 8 are classified into the two following types. The bumps 7b and 8b inserted in the bump positioning guides 5 in the U shape as seen in plan view are stud bumps for electrical connection. The bumps 7c and 8c inserted in the bump positioning guides 6 in the shape of the rectangular frame as seen in plan view are dummy bumps. It is preferable that the flip-chip mounting used herein is flip-chip mounting using ultrasonic waves from the viewpoint of preventing heat damages to the optical waveguide section $W_0$.

For the mounting of the light-emitting element 7 and the light-receiving element 8, the bump positioning guides 5 and 6 are formed by the single photolithographic process, as mentioned earlier. Thus, the bump positioning guides 5 and 6 are located in the predetermined positions relative to each end portion of the core 2. Therefore, the high-accuracy positioning of the light-emitting element 7 and the light-receiving element 8 is achieved easily by inserting the bumps 7b, 7c, 8b and 8c of the light-emitting and light-receiving elements 7 and 8 into the hollow portions 5a and 6a of the bump positioning guides 5 and 6 in the U shape and in the shape of the rectangular frame as seen in plan view. As a result, the productivity of the opto-electric hybrid module is improved.

Figure 7A:
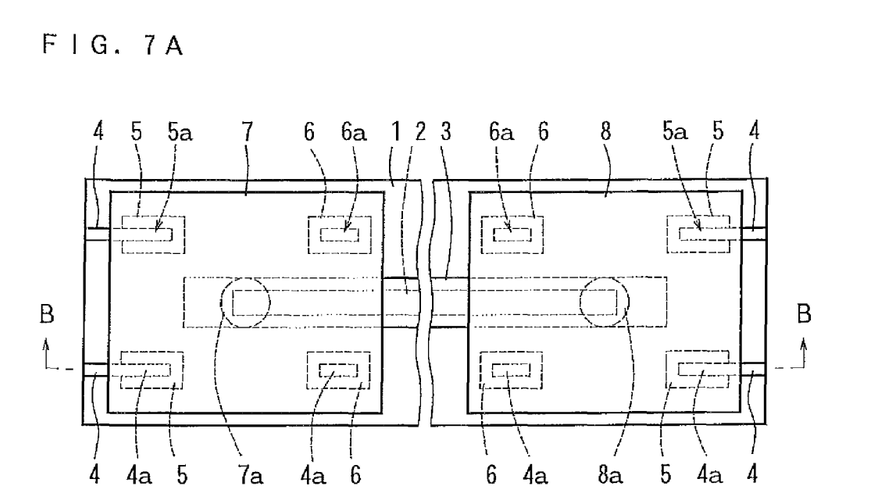
FIG. 7A is a plan view schematically showing an opto-electric hybrid module according to a second embodiment of the present invention.
Figure 7B:
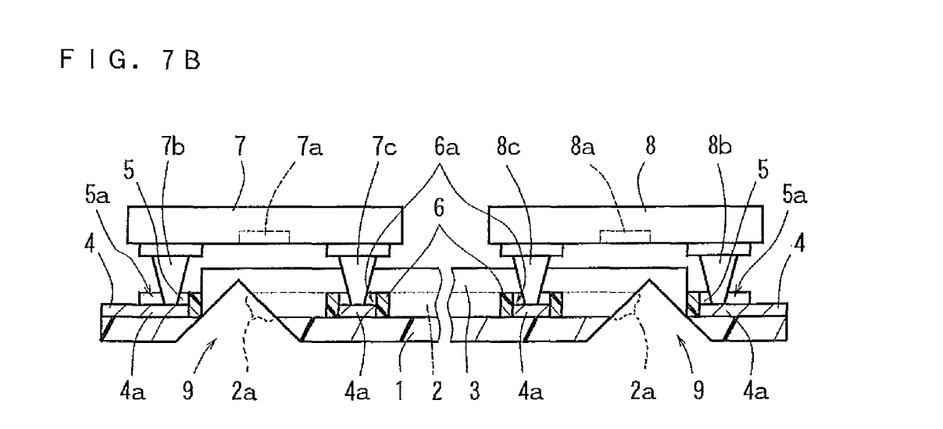
FIG. 7B is a sectional view taken along the line B-B of FIG. 7A.

FIG. 7A is a plan view schematically showing an opto-electric hybrid module according to a second embodiment of the present invention. FIG. 7B is a sectional view taken along the line B-B of FIG. 7A. The opto-electric hybrid module according to the second embodiment is such that the over cladding layer 3 is formed so as to cover only the core 2, with the electric circuit 4 and the bump positioning guides 5 and 6 uncovered. The optical elements 7 and 8 are placed over the under cladding layer 1 (although part of optical elements 7 and 8 is placed over the over cladding layer 3). The optical elements 7 and 8 are flip-chip mounted, with the bumps 7b, 7c, 8b and 8c of the optical elements 7 and 8 inserted in the hollow portions 5a and 6a of the bump positioning guides 5 and 6 in the U shape and in the shape of the rectangular frame as seen in plan view without the over cladding layer 3 therebetween. The remaining parts of the opto-electric hybrid module according to the second embodiment are similar to those of the opto-electric hybrid module according to the first embodiment shown in FIGS. 1A and 1B. Like reference numerals and characters are used to designate similar parts.

Like the first embodiment shown in FIGS. 1A and 1B, the second embodiment provides a short distance between the optical elements 7 and 8 and the end portions of the core 2 to improve the efficiency of light coupling between the optical elements 7 and 8 and the end portions of the core 2. Further, the bump positioning guides 5 and 6 facilitates the high-accuracy positioning of the optical elements 7 and 8. Thus, the second embodiment is excellent in the productivity of the opto-electric hybrid module.

In the first and second embodiments described above, the bump positioning guides 5 and 6 for the positioning of the bumps 7b, 7c, 8b and 8c of the optical elements 7 and 8 are equal in number (in the first and second embodiments, four) to the bumps 7b, 7c, 8b and 8c of the optical elements 7 and 8. However, the number of bump positioning guides 5 and 6 may be less than the number of bumps 7b, 7c, 8b and 8c of the optical elements 7 and 8. Also, the bump positioning guides 5 and 6 need not be formed. It should be noted that, when the number of bump positioning guides 5 and 6 is less than the number of bumps 7b, 7c, 8b and 8c of the optical elements 7 and 8, the high-accuracy positioning of the optical elements 7 and 8 takes time, which in turn results in the poor productivity of the opto-electric hybrid module.

Next, an inventive example of the present invention will be described in conjunction with a conventional example. It should be noted that the present invention is not limited to the inventive example.

EXAMPLES

Inventive Example

Material for Formation of Under Cladding Layer and Over Cladding Layer

A material for formation of an under cladding layer and an over cladding layer was prepared by mixing 35 parts by weight of bisphenoxyethanol fluorene glycidyl ether (component A), 40 parts by weight of 3',4'-epoxycyclohexyl methyl-3,4-epoxycyclohexane carboxylate which is an alicyclic epoxy resin (CELLOXIDE 2021P available from Daicel Chemical Industries, Ltd.) (component B), 25 parts by weight of (3'4'-epoxycyclohexane)methyl-3',4'-epoxycyclohexyl-carboxylate (CELLOXIDE 2081 available from Daicel Chemical Industries, Ltd.) (component C), and 2 parts by weight of a 50% by weight propione carbonate solution of 4,4'-bis[di($\beta$-hydroxyethoxy) phenylsulfinio]phenyl-sulfide-bis-hexafluoroantimonate (component D).

Material for Formation of Core and Bump Positioning Guides

A material for formation of a core and bump positioning guides was prepared by dissolving 70 parts by weight of the aforementioned component A, 30 parts by weight of 1,3,3-tris{4-[2-(3-oxetanyl)]butoxyphenyl}butane and one part by weight of the aforementioned component D in ethyl lactate.

Manufacture of Opto-Electric Hybrid Module

The material for the formation of the under cladding layer was applied to a surface of a polyethylene terephthalate (PET) film (having a thickness of 188 µm) with an applicator. Thereafter, the applied material was exposed to ultraviolet light irradiation (having a wavelength of 365 nm) at a dose of 2000 mJ/cm$^2$. This formed the under cladding layer (having a thickness of 25 µm), with reference to FIG. 2A.

Then, the material for the formation of the core and the bump positioning guides was applied to a surface of the under cladding layer with an applicator. Thereafter, a drying process was performed at 100° C. for 15 minutes to form a photosensitive resin layer having a future core region and future bump positioning guide regions, with reference to FIG. 2B. Next, a synthetic quartz chrome mask (photomask) formed with an opening pattern identical in shape with the pattern of the core and the bump positioning guides was placed over the photosensitive resin layer. Then, the photosensitive resin layer was exposed to ultraviolet light irradiation (having a wavelength of 365 nm) directed from over the mask at a dose of 4000 mJ/cm$^2$ by a proximity exposure method. Thereafter, a heating treatment was performed at 80° C. for 15 minutes. Next, development was performed using an aqueous solution of γ-butyrolactone to dissolve away unexposed portions of the photosensitive resin layer. Thereafter, a heating treatment was performed at 120° C. for 30 minutes. This formed the core (having a thickness of 50 µm, and a width of 50 µm) and the bump positioning guides (having a thickness of 50 µm, and U-shaped and rectangular frame-shaped line width of 15 µm), with reference to FIG. 2C.

Next, an electrically conductive silver paste was formed in a linear shape on predetermined portions of the surface of the under cladding layer by screen printing. Thereafter, a curing process (at 150° C. for one hour) was performed on the electrically conductive silver paste to form an electric circuit, with reference to FIGS. 4A and 4B. Part of the electric circuit corresponding to hollow portions of the bump positioning guides in the U shape and in the shape of the rectangular frame as seen in plan view was used as mounting pads.

Next, the material for the formation of the over cladding layer was applied to the surface of the under cladding layer with an applicator so as to cover the core, the bump positioning guides and the electric circuit, thereby forming a photosensitive resin layer, with reference to FIG. 5A. Thereafter, the photosensitive resin layer was exposed to ultraviolet light irradiation (having a wavelength of 365 nm) at a dose of 2000 mJ/cm$^2$ through a photomask designed so that part of the photosensitive resin layer covering the mounting pads was not exposed to the irradiation. Thereafter, a heating treatment was performed at 120° C. for 15 minutes. Next, development was performed using an aqueous solution of γ-butyrolactone to dissolve away unexposed portions of the photosensitive resin layer. Thereafter, a heating treatment was performed at 120° C. for 30 minutes. This formed the over cladding layer in which the portions dissolved away corresponded to through holes, to uncover the mounting pads in the through holes, with reference to FIG. 5B. At this time, the total thickness of the under cladding layer, the core, and the over cladding layer was 100 µm.

Then, the PET film was stripped from the back surface of the under cladding layer. Thereafter, a dicing blade including a V-shaped edge having an included angle of 90 degrees was used to cut opposite end portions of the core from the back surface side of the under cladding layer, thereby causing the opposite end portions of the core to be formed into respective light reflecting surfaces inclined at 45 degrees. The light reflecting surfaces were formed under a light-emitting section of a light-emitting element to be mounted in the next step and under a light-receiving section of a light-receiving element to be mounted in the next step, with reference to FIG. 6A.

Then, a flip chip bonder was used to insert bumps of the light-emitting and light-receiving elements through the through holes of the over cladding layer into the hollow portions of the bump positioning guides in the U shape and in the shape of the rectangular frame as seen in plan view and thereafter to connect the bumps to the mounting pads, thereby flip-chip mounting the light-emitting and light-receiving elements by using the electrically conductive silver paste as a bonding material, with reference to FIG. 6B. A VCSEL (available from U-L-M photonics GmbH) was used as the light-emitting element, and a PD (a photodiode available from Hamamatsu Photonics K.K.) was used as the light-receiving element. In this manner, an opto-electric hybrid module was manufactured.

Conventional Example

An electric circuit section in which an electric circuit was formed on a surface of a substrate, and an optical waveguide section in which an under cladding layer, a core and an over cladding layer were disposed in the order named (and in which the opposite end portions of the core were formed into respective light reflecting surfaces inclined at 45 degrees, as in Inventive Example) were produced individually. The back surface of the substrate of the electric circuit section was bonded to the front surface of the over cladding layer with an adhesive. A light-emitting element (VCSEL) and a light-receiving element (PD) were mounted on portions of the electric circuit section corresponding to the opposite end portions, respectively, of the core. In this manner, an opto-electric hybrid module was manufactured, with reference to FIG. 8.

Light Propagation Test

Ten opto-electric hybrid modules according to Inventive Example and ten opto-electric hybrid modules according to Conventional Example were manufactured. A driving current of 5 mA was fed through the light-emitting element in each of the opto-electric hybrid modules to cause the light-emitting element to emit light. The light was received by the light-receiving element through the core in each of the opto-electric hybrid modules. Then, a voltage developed across the light-receiving element was measured with a tester. As a result, the voltage measured in the range of 1.0 to 1.3 V in the opto-electric hybrid modules according to Inventive Example. On the other hand, the voltage measured in the range of 0.5 to 0.7 V in the opto-electric hybrid modules according to Conventional Example.

This result shows that the efficiency of light coupling between the optical elements and the end portions of the core is much higher in the opto-electric hybrid modules according to Inventive Example than in the opto-electric hybrid modules according to Conventional Example.

Industrial Applicability

The opto-electric hybrid module according to the present invention may be used for information communications devices and signal processors for transmitting and processing digital signals representing sound, images and the like at high speeds.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. An opto-electric hybrid module comprising:
   an optical waveguide section;
   an electric circuit section; and
   an optical element mounted on the electric circuit section,
   said optical waveguide section including
   an under cladding layer,
   a linear core for an optical path, the core being formed in a protruding condition on a surface of the under cladding layer, and
   an over cladding layer formed so as to cover the core,
   said electric circuit section being formed on a surface portion of the under cladding layer except where the core is formed, without any substrate,
   bump positioning guides for positioning bumps of the optical element formed in a protruding condition on the surface of the under cladding layer and placed in predetermined positions relative to an end portion of the core,
   the bumps of the optical element being positioned using the bump positioning guides.

2. The opto-electric hybrid module according to claim 1,
   wherein the optical element is positioned on the over cladding layer, and
   wherein the optical element includes bumps, and is electrically connected to the electric circuit section through the bumps thereof inserted through through holes formed in the over cladding layer.

3. The opto-electric hybrid module according to claim 1,
   wherein the optical element is positioned on the under cladding layer, and
   wherein the optical element includes bumps, and is electrically connected to the electric circuit section through the bumps thereof.

4. A method of manufacturing an opto-electric hybrid module, comprising the steps of:
   (a) producing an optical waveguide section;
   (b) producing an electric circuit section; and
   (c) mounting an optical element onto the electric circuit section;
   said step (a) including the steps of
   (a-1) forming an under cladding layer,
   (a-2) forming a photosensitive resin layer on a surface of the under cladding layer, and thereafter, forming a linear core for an optical path and bump positioning guides for positioning bumps of the optical element at the same time by a single photolithographic process performed on the photosensitive resin layer, and
   (a-3) forming an over cladding layer on the surface of the under cladding layer so as to cover the core,
   the electric circuit section being produced in said step (b) on a surface portion of the under cladding layer except where the core is formed, without any substrate,
   the optical element being mounted in said step (c) while the bumps of the optical element are positioned by using the bump positioning guides.

5. The method according to claim 4,
   wherein said step (c) includes the steps of:
   (c-1) positioning the optical element on the over cladding layer; and
   (c-2) electrically connecting the optical element to the electric circuit section through the bumps inserted through through holes formed in the over cladding layer.

6. The method according to claim 4,
   wherein said step (c) includes the steps of:
   (c-1) positioning the optical element on the under cladding layer; and
   (c-2) electrically connecting the optical element to the electric circuit section through the bumps.

* * * * *